United States Patent
Walter et al.

(10) Patent No.: US 9,815,686 B2
(45) Date of Patent: Nov. 14, 2017

(54) MICROELECTROMECHANICAL DEVICE AND SYSTEM WITH LOW-IMPEDANCE RESISTIVE TRANSDUCER

(71) Applicants: Vmicro, Villeneuve d'Ascq (FR); CENTRE NATIONAL DE LA RECHERCHE SCIENTIFIQUE, Paris (FR)

(72) Inventors: Benjamin Walter, Lille (FR); Marc Faucher, Lesquin (FR)

(73) Assignees: VMICRO, Villeneuve d'Ascq (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/293,147

(22) Filed: Oct. 13, 2016

(65) Prior Publication Data

US 2017/0113918 A1 Apr. 27, 2017

(30) Foreign Application Priority Data

Oct. 23, 2015 (FR) ..................................... 15 60144

(51) Int. Cl.
*H01L 27/14* (2006.01)
*B81B 3/00* (2006.01)

(52) U.S. Cl.
CPC ........ *B81B 3/0045* (2013.01); *B81B 2201/02* (2013.01); *B81B 2201/031* (2013.01); *B81B 2203/0118* (2013.01)

(58) Field of Classification Search
CPC .......... B81B 2201/02; B81B 2201/031; B81B 3/0045; B81B 2203/0118
See application file for complete search history.

(56) References Cited

U.S. PATENT DOCUMENTS

| 6,690,178 B2* | 2/2004 | Harris ................ G01R 31/2621 324/109 |
| 2010/0024572 A1* | 2/2010 | Roukes .................. G01L 1/044 73/862.625 |

(Continued)

FOREIGN PATENT DOCUMENTS

| EP | 1 316 977 A2 | 6/2003 |
| FR | 2 964 653 A1 | 3/2012 |

(Continued)

OTHER PUBLICATIONS

Beardslee et al., "Thermal Excitation and Piezoresistive Detection of Cantilever In-Plane Resonance Modes for Sensing Applications," Journal of Microelectromechanical Systems, vol. 19, No. 4, Apr. 1, 2010, pp. 1015-1017, XP011312002.

(Continued)

*Primary Examiner* — Yosef Gebreyesus
(74) *Attorney, Agent, or Firm* — Baker & Hostetler LLP

(57) ABSTRACT

A microelectromechanical device comprising a mechanical structure extending along a longitudinal direction, linked to a planar substrate by an anchorage situated at one of its ends and able to flex in a plane parallel to the substrate, the mechanical structure comprises a joining portion, which links it to each anchorage and includes a resistive region exhibiting a first and second zone for injecting an electric current to form a resistive transducer, the resistive region extending in the longitudinal direction from an anchorage and arranged so a flexion of the mechanical structure in the plane parallel to the substrate induces a non-zero average strain in the resistive region and vice versa; wherein: the first injection zone is carried by the anchorage; and the second injection zone is carried by a conducting element not fixed to the substrate and extending in a direction, termed lateral, substantially perpendicular to the longitudinal direction.

17 Claims, 12 Drawing Sheets

(56) References Cited

U.S. PATENT DOCUMENTS

| | | | |
|---|---|---|---|
| 2010/0223981 A1* | 9/2010 | Johannessen | A61B 5/14503 73/64.47 |
| 2011/0096560 A1* | 4/2011 | Ryu | C09K 11/0883 362/510 |
| 2013/0154440 A1 | 6/2013 | Hentz | |

FOREIGN PATENT DOCUMENTS

| WO | 2006/060937 A1 | 6/2006 |
|---|---|---|
| WO | 2011/038470 A1 | 4/2011 |

OTHER PUBLICATIONS

John H. Comtois et al., "Thermal microactuators for surface-micromachining processes," SPIE, vol. 2642, pp. 10-21.

* cited by examiner

MICROELECTROMECHANICAL DEVICE AND SYSTEM WITH LOW-IMPEDANCE RESISTIVE TRANSDUCER

CROSS-REFERENCE TO RELATED APPLICATIONS

This application claims priority to foreign French patent application No. FR 1560144, filed on Oct. 23, 2015, the disclosure of which is incorporated by reference in its entirety.

FIELD OF THE INVENTION

The invention pertains to a microelectromechanical device and system. More particularly, it pertains to a microelectromechanical device comprising a transducer of resistive type making it possible to actuate and/or detect an "in-plane" flexion motion of a mechanical structure of elongate shape, as well as to a microelectromechanical system comprising such devices.

BACKGROUND

It is well known to produce microelectromechanical systems (MEMSs, standing for Micro Electro Mechanical Systems) comprising a mechanical structure of built-in beam ("cantilever") type extending from the edge of a planar substrate and which is able to flex in a plane perpendicular to that of the substrate. Such structures have been used, notably, to produce atomic force microscope probes. They operate well in a vacuum or in air, but not in a liquid medium since the vibrations of the beam are then heavily damped by the viscosity of the medium. To solve this problem, it has been necessary to develop MEMSs exhibiting a mechanical structure of beam type flexing in the plane of the substrate or exhibiting a translation motion in this same plane. In the latter case, the beam can be rigid and its translation motion be induced by the flexion—also in the plane—of one or more lateral bracing arms.

A need therefore exists for a microelectromechanical system making it possible to actuate—and to detect—a flexion motion in the plane of a structure of beam type (or, more generally, exhibiting an elongate shape).

A certain amount of research work has proposed that this need be addressed by using actuators of thermal type and piezo-resistive detectors. Such a solution exhibits the advantage of being compatible with the use of a large number of materials contrary, for example, to piezoelectric transduction. Furthermore one and the same structure can serve both as thermal actuator (the heat being produced through the Joule effect) and as piezo-resistive detector.

The article by J. H. Comtois, V. M. Bright and M. W. Phipps "Thermal microactuators for surface-micromachining processes", Proc. SPIE 2642, Micromachined Devices and Components, 10 (15 Sep. 1995) describes a silicon flexion structure, composed of two parallel arms, linked together by their distal end (opposite to the anchorages) and carrying a resistive track forming a "U", which makes it possible to pass a current between the two anchorages. This current gives rise to heat through the Joule effect; one of the arms ("cold arm") is intentionally enlarged so as to promote convective exchanges with the exterior and to decrease the power density in the silicon; thus this arm heats up less than the other (termed the "hot arm"). The more significant thermal expansion of the hot arm then causes flexion of the structure in the plane. This structure is designed for static operation; in any event, the relatively significant mass of the cold arm would penalize any rise in frequency. Furthermore, the resistive track necessarily exhibits a significant length (about twice that of the structure), and therefore a high resistance. Now, in order to obtain efficient power transfer between the transducer and external electronic appliances (power supplies, signal generators, measurement circuits, etc.), the impedance of the transducer ought to be as close as possible to 50Ω (Ohms).

The article by L. A. Beardslee, A. M. Addous, S. Heinrich, F. Josse, I. Dufour and O. Brand "Thermal Excitation and Piezoresistive Detection of Cantilever In-Plane Resonance Modes for Sensing Applications" Journal of Microelectromechanical Systems, Vol. 19, No. 4, August 2010 describes a structure comprising a silicon beam clamped at one end and carrying, near its anchorage and on opposite sides, two resistances obtained by doping. Metallic tracks connect the ends of the resistances and enable an electric current to be injected thereinto. The injection of a current into the resistance on the right causes heating through the Joule effect, which in its turn induces a thermal expansion of the right side of the beam and therefore its flexion towards the left; reciprocally in the case where current is injected into the left resistance. A structure forming a Wheatstone bridge—also obtained by virtue of resistive regions fabricated by doping and interconnected by metallic tracks—allows measurement of the flexion through the piezo-resistive effect. The width of the beam goes from 45 and 90 microns and its length from 200 to 1000 microns; one is therefore dealing with a structure of relatively significant size. A high degree of miniaturization—for example by taking a width of 5 μm—would encounter several problems; in particular, it would be necessary to use very fine and very closely spaced conducting tracks, which would lead to difficulties with insulation and to a high impedance.

More generally, the prior art does not make it possible to obtain transducers of resistive type (thermal actuators and/or piezo-resistive sensors) which are both miniaturizable—this being necessary to allow operation at high frequency (greater than or equal to 1 MHz)—and of low impedance (less than or equal to 100Ω, preferably substantially equal to 50Ω)—thereby allowing efficient electrical power transfer.

SUMMARY OF THE INVENTION

The invention is aimed at overcoming these drawbacks of the prior art.

A subject of the invention, making it possible to achieve this aim, is a microelectromechanical device comprising a mechanical structure extending mainly along a direction, termed longitudinal, and linked to a planar substrate parallel to the said longitudinal direction by at least one anchorage situated at one of its ends along the said longitudinal direction and able to flex in a plane parallel to the substrate, the said mechanical structure comprising a portion, termed the joining portion, which links it to the said or to each said anchorage and which includes a resistive region exhibiting a first and a second zone for injecting an electric current so as to form a resistive transducer, the said resistive region extending mainly in the said longitudinal direction from the said or from a said anchorage and being arranged in such a way that a flexion of the said mechanical structure in the said plane parallel to the substrate induces a non-zero average strain in the said resistive region and vice versa; wherein:

the said first injection zone is carried by the said anchorage; and the said second injection zone is carried by a conducting element not fixed to the said substrate and extending in a direction, termed lateral, substantially perpendicular to the said longitudinal direction.

Another subject of the invention is a microelectromechanical system comprising a first microelectromechanical device according to an embodiment of the invention, of the type comprising an electrical actuation circuit, and a second microelectromechanical device according to an embodiment of the invention, of the type comprising an electrical detection circuit, in which the mechanical structures of the first and of the second device are mechanically coupled, the actuation circuit of the first device is configured to inject an alternating electrical signal at a frequency, termed the actuation frequency, superimposed on a direct electrical signal or at a different frequency from the actuation frequency, and the detection circuit of the second device is configured to measure a variation in resistance at the same frequency.

Yet another subject of the invention is a microelectromechanical system comprising a first microelectromechanical device according to an embodiment of the invention, of the type with differential actuation at frequency f/2, and a second microelectromechanical device according to an embodiment of the invention, of the type with differential detection, in which the mechanical structures of the first and of the second device are mechanically coupled, the actuation circuit of the first device is configured to inject an alternating electric current at a first frequency and the detection circuit of the second device is configured to measure a variation in resistance at a second frequency, double the first.

Yet another subject of the invention is a microelectromechanical system comprising a first device according to an embodiment of the invention, of the type with detection, and a second microelectromechanical device according to an embodiment of the invention, of the type with actuation, in which the mechanical structures of the first and of the second device are mechanically coupled, the actuation circuit of the first device is configured to inject an alternating electrical signal at a first frequency, without superposition with a direct electrical signal, and the detection circuit of the second device is configured to measure a variation in resistance at a second frequency, double the first.

BRIEF DESCRIPTION OF THE DRAWINGS

Other characteristics, details and advantages of the invention will emerge on reading the description with reference to the appended drawings given by way of example and in which.

DETAILED DESCRIPTION

A microelectromechanical beam—or more generally a mechanical structure exhibiting an elongate shape—can be excited in flexion by means of a thermal actuator utilizing the Joule effect and thermal expansion. The thermal actuator typically consists of a resistive element located in a zone of the beam where the strain is of a single sign, for example on one side of a neutral fibre (more generally, it suffices that the average strain in the resistive element be non-zero). If the actuator is sufficiently miniaturized, it can attain an operating frequency of several MHz, or indeed hundreds of MHz. More precisely, if heat transport in a wire of length L, of thermal conductivity $\kappa$, density $\rho_m$ and specific heat $C_p$ is considered, it is possible to calculate a cutoff frequency $\omega_{th}$ according to the formula:

$$\omega_{th} = \frac{\pi \kappa}{\rho_m C_p L^2} \quad (1)$$

For example, in the case of a silicon wire, the cutoff frequency equals about 2.5 MHz for L=10 μm, 10 MHz for L=5 μm and 250 MHz for L=1 μm.

Figure 1A:
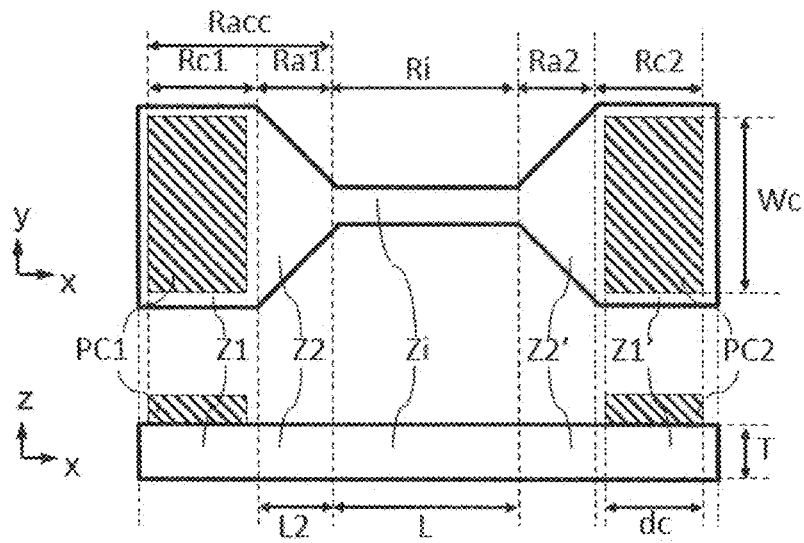
FIGS. 1a and 1b illustrate the calculation of the impedance of a thermal actuator or piezo-resistive sensor.

FIG. 1a shows two views (from the top and from the side) of a resistive transducer—able to serve as thermal actuator or as piezo-resistive sensor—produced in semi-conductor on silicon technology. The transducer consists of a doped silicon planar structure of thickness T and resistivity $\rho$, on which are deposited two metallic contact pads PC1, PC2 at the ends of the planar structure. The latter comprises five distinct zones: a first contact zone Z1, covered by the contact pad PC1 and forming an ohmic contact with it, a first junction region Z2 of length L2 narrowing progressively, a zone of constant width W (much smaller than the width of the contact zone) and of length L, a second junction region Z2' symmetric with Z2 and a second contact zone Z1' covered by the contact pad PC2 and forming an ohmic contact with it. These various regions exhibit a resistance $R_{c1}$, $R_{a1}$, $R_i$, $R_{a2}$, $R_{c2}$ respectively, and the overall resistance equals:

$$R = R_{c1} + R_{a1} + R_i + R_{a2} + R_{C2}$$

The "intrinsic" term $R_i$ equals $$\rho \frac{L}{W \cdot T}.$$

To decrease the value thereof, it is possible to use a high doping so as to reduce the resistivity $\rho$, but only up to a certain point. In silicon, for example, limit dopings of a few $10^{21}$ at/cm$^3$ are used in practice. Beyond this, amorphization problems or solubility limit problems occur.

The access resistance $R_{acc}$ takes into account the path of the current from each metallic contact up to the "intrinsic" region Zi. To a first approximation, it may be considered that it consists of $R_{c1} + R_{a1}$ at one end of the transducer, and $R_{c2} + R_{a2}$ at the opposite end. The contributions $R_{a1}$, $R_{a2}$ take into account the current path between each contact and the intrinsic zone and will be able to be decreased by taking the smallest possible lengths L2, L2'.

The contact resistances $R_{c1}=R_{c2}=R_c$ can be calculated by virtue of the formula:

$$R_C = \frac{\sqrt{\rho_C R_{sq}}}{W_c} * \coth\left(\frac{d_C}{\sqrt{\rho_C/R_{sq}}}\right) \quad (2)$$

where:
- $R_{sq}$: resistance of the doped semi-conductor layer (in Ohms/square)
- $\rho_c$: specific contact resistance
- $W_c$: width of the contact
- $d_c$: length of the contact
- coth: hyperbolic cotangent.

Figure 1B:
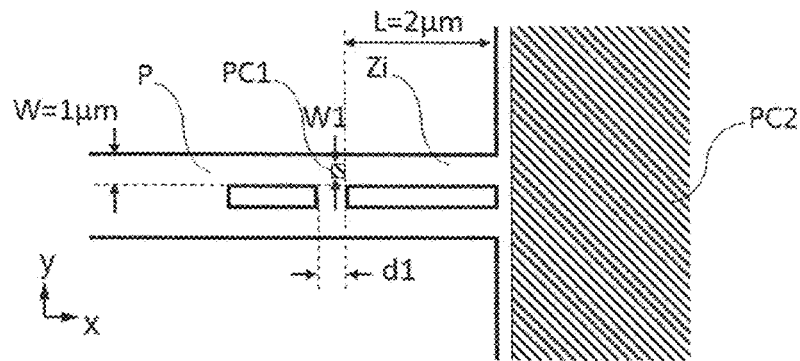

FIG. 1b illustrates a resistive transducer TR arranged to allow flexion in the plane of a simply built-in beam P, made of silicon. As explained above, the transducer must be arranged on one side of the neutral fibre, corresponding here to the longitudinal axis of the beam. The join zone where the beam meets the substrate exhibits two openings which give it an "H"-shaped structure. A half-leg of the "H" is utilized to produce the transducer.

Whilst the contact pad PC2, produced above the substrate into which the beam is built, may exhibit a significant surface area, and therefore a low contact resistance, the dimensions—length d1 and especially width W1—of the contact pad PC1 are constrained by those of the actuator, which in their turn are determined by the desired cutoff frequency. We take, for example:
- W1=d1=0.5 μm: width of the contact,
- $R_{sq}=20\Omega$ (corresponding to a silicon layer of thickness equal to 400 nm boron-doped with a density of $3\cdot10^{14}$ at/cm$^2$),
- $\rho_c=3\cdot10^{-7}$ $\Omega$cm$^2$ (typical for an aluminium contact on boron-doped silicon).

Under these conditions, the contact resistance of the pad PC1 equals 208Ω and dominates the intrinsic resistance, which equals about 40Ω.

Under these conditions, the resistance of the transducer can only be substantially greater than 50Ω, thereby compromising the efficiency of the power transfer with exterior electronic equipment, which is generally rated to interface with loads or signal sources exhibiting an impedance of this value.

Equation (2) indicates that the contact resistance can be decreased by increasing the dimensions $d_c$, $W_c$ of the contact (d1, W1 in the case of FIG. 1b); the width $W_c$ is particularly significant, while the contribution of the length $d_c$ becomes less significant when $d_c\sqrt{\rho_c/R_{sq}}$. An idea underlying the present invention is that the width of the ohmic contact can be increased by virtue of an injection zone, or "lateral injector", which is a conducting lateral extension of the beam, on which a contact pad is deposited.

Figure 2:
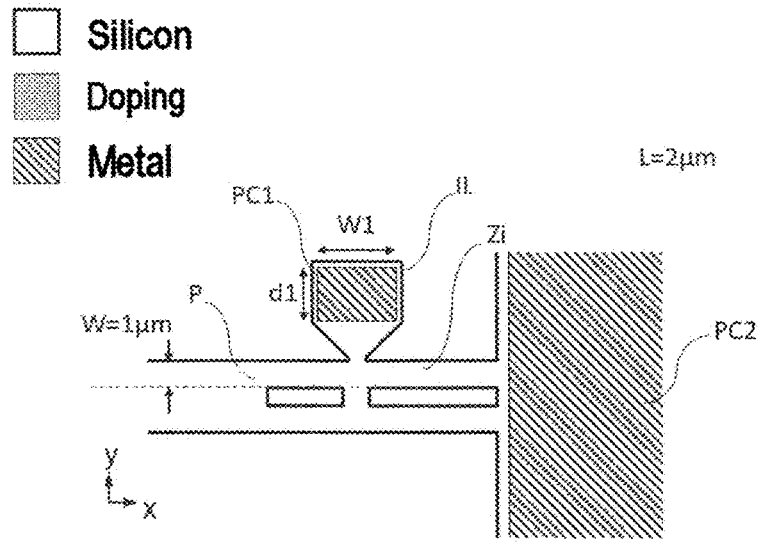
FIG. 2 illustrates the use of a lateral injector to reduce this impedance, in accordance with the invention.

FIG. 2 shows the structure of FIG. 1b modified by the addition of an injection zone or lateral injector IL, made of doped silicon and extending perpendicularly to the longitudinal axis of the beam P and carrying a metal contact pad PC1 of much more significant dimensions than in the case of FIG. 1b. By taking W1=5 μm and d1=4 μm we obtain Rc=5Ω. The lateral injection zone, furthermore, facilitates the evacuation of heat from the transducer. Admittedly, in principle its mass can have the undesirable effect of lowering the resonant frequency but, since it is arranged in proximity to where the beam P is built-in, in practice it hardly affects the mechanical behaviour of the device.

Figure 6:
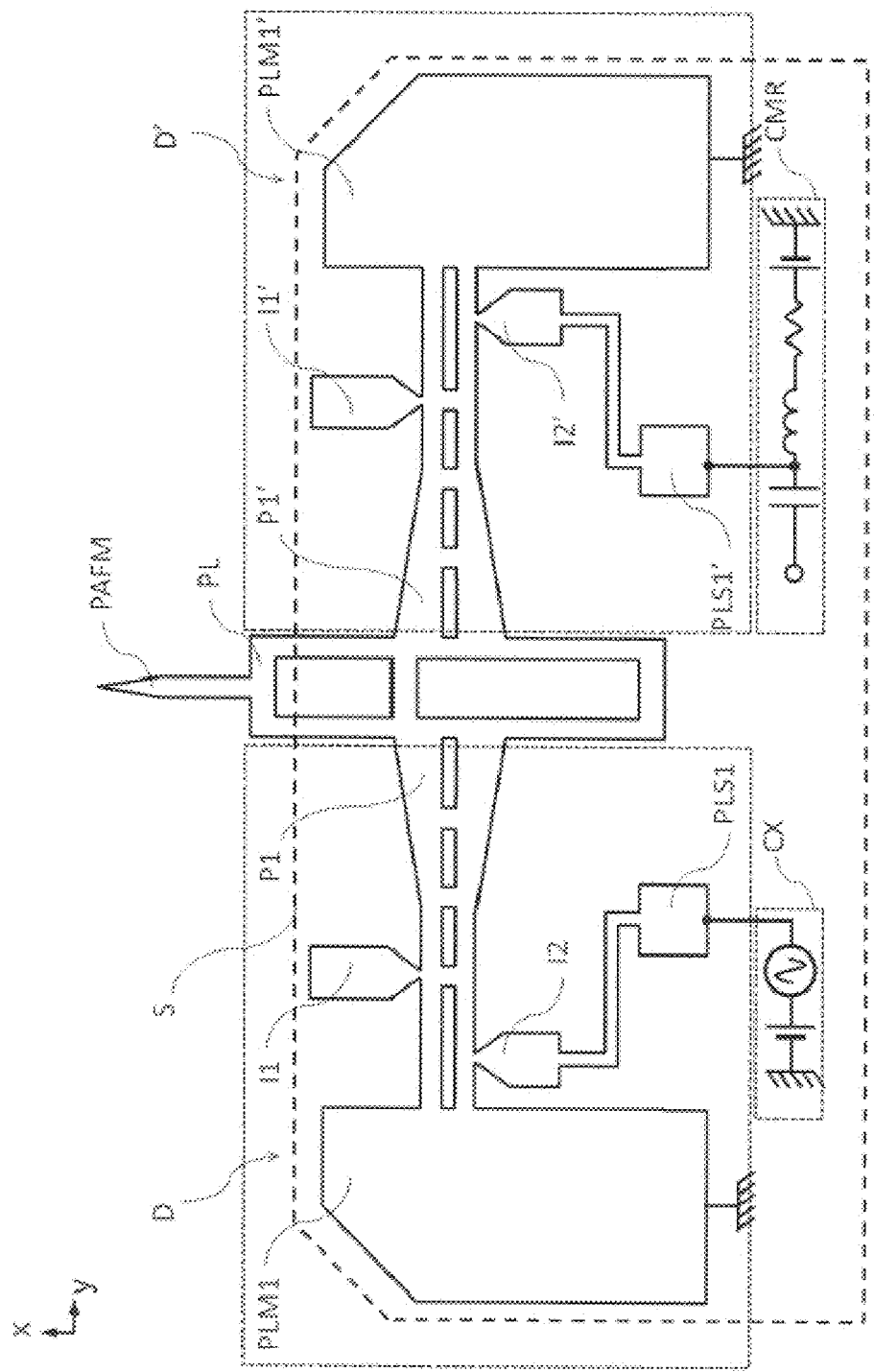
FIGS. 6 to 8 show three systems according to a fifth, a sixth and a seventh embodiment of the invention, respectively.
Figure 7:
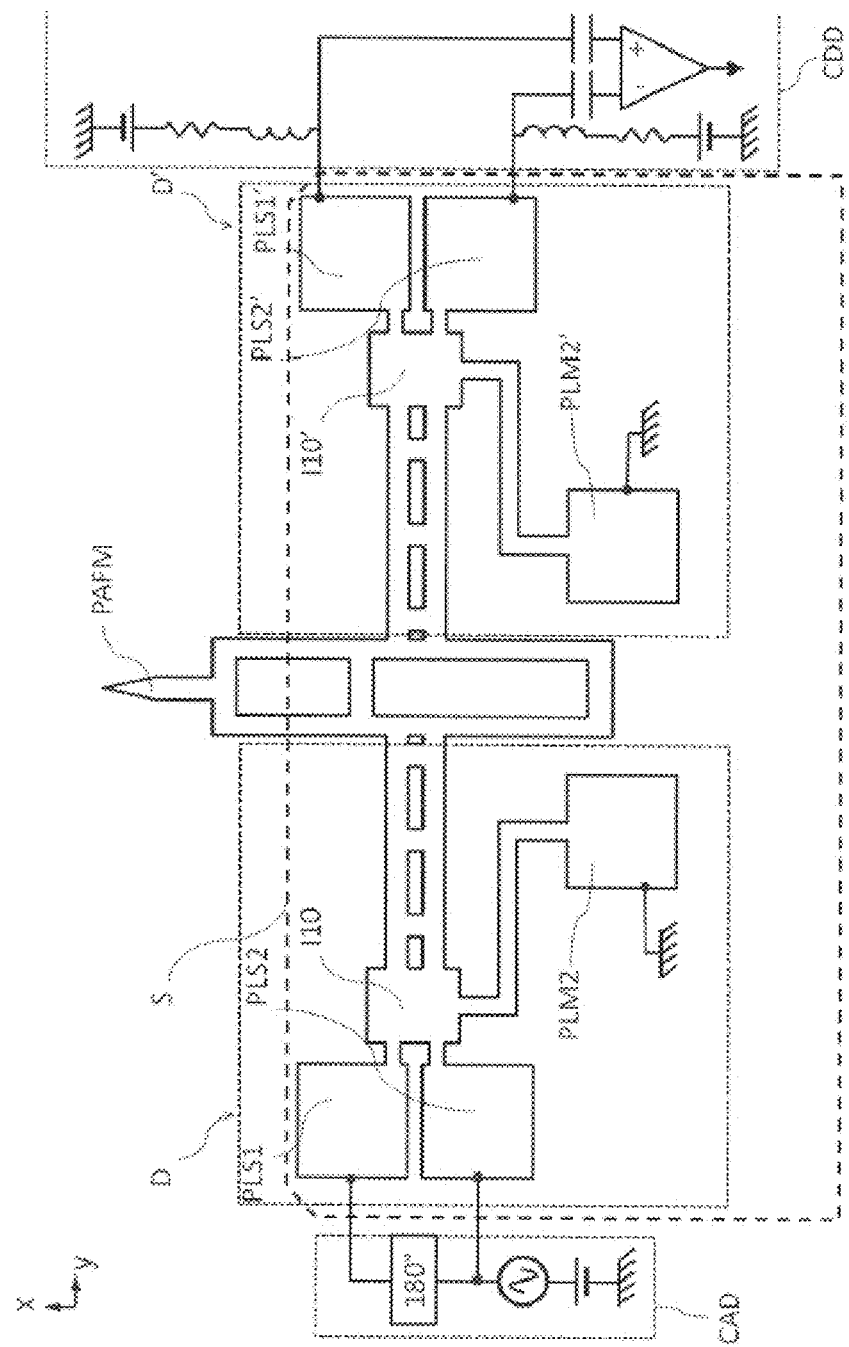
Figure 8:
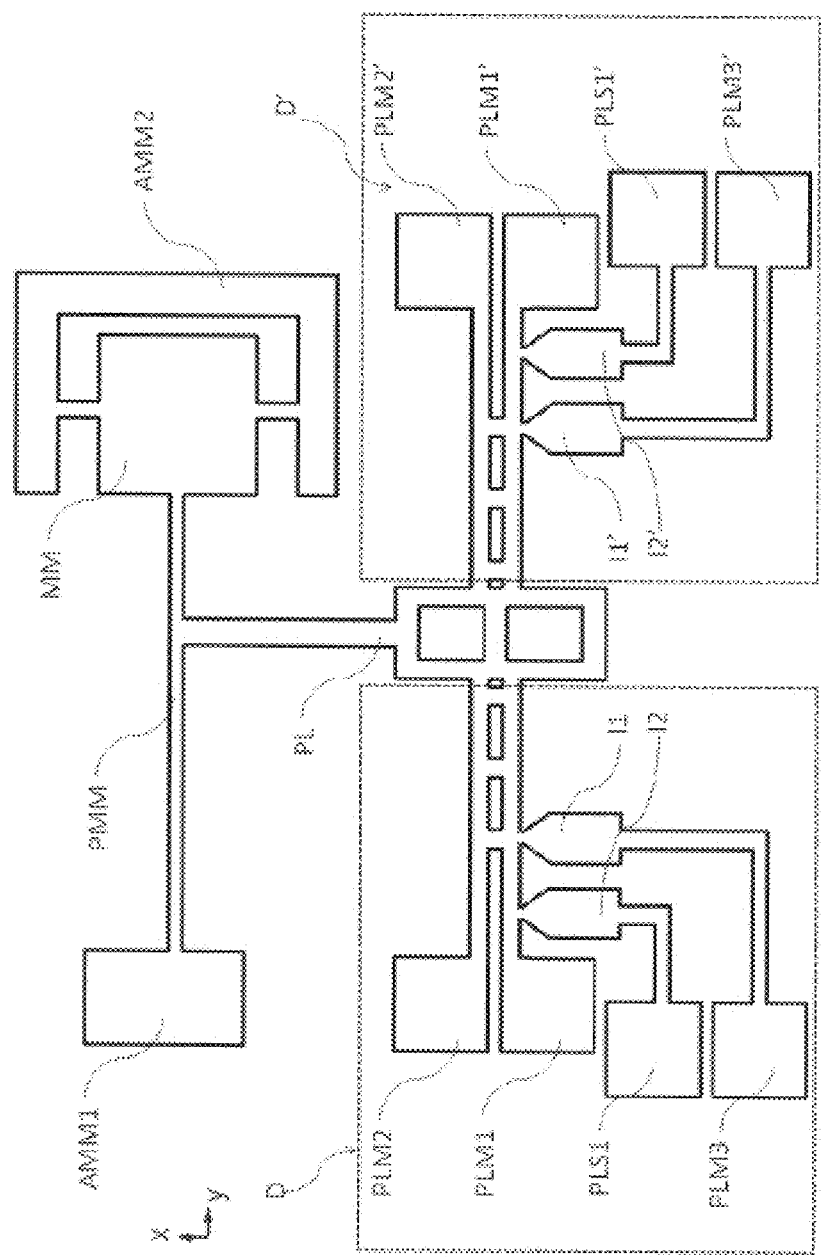

Whilst FIG. 2 essentially constitutes a basic diagram, FIGS. 3a to 5 illustrate devices according to various advantageous embodiments of the invention. FIGS. 6 to 8 illustrate microelectromechanical systems comprising two devices of this type, as well as the associated actuation and detection electronics.

A device according to the invention can be produced in silicon on insulator (SOI) technology. In this case, it comprises a relatively thick (thickness typically between 350 and 600 μm) silicon planar substrate on which is deposited an oxide layer SiO$_2$ termed "buried oxide" (or "BOX", standing for "Buried OXide"), and then a very fine silicon layer (between 5 nm and 100 μm, preferably between 100 nm and 1 μm) termed the device layer (DL), on which can be deposited metallic layers to produce contacts and conducting tracks; the term "metal" should be understood in the broad sense of a material exhibiting a conductivity of metallic type, including for example degenerate semi-conductors. The device layer can comprise intrinsic, substantially insulating regions and doped, conducting regions with a higher or lower resistance; the deposition of metallic layers on the doped regions of the device layer can lead to the formation of ohmic contacts.

Certain regions of the device layer can be freed by eliminating the subjacent buried oxide; in particular, a device according to the invention comprises a freed structure extending in a longitudinal direction (for example a beam), fixed to the substrate at one of its ends; the lateral injectors are also obtained on the basis of doped and freed regions of the device layer. As a variant, the structure of beam type and/or the lateral injector or injectors can be produced in part in the device layer and in part in other materials.

The resistances of the transducers can be obtained in different ways:
- on the basis of doped regions of the device layer, the dopant concentration being chosen so as to adjust the impedance (typically with a density of between $10^{17}$ and $10^{21}$ at/cm$^3$, preferably between $10^{19}$ and $5\cdot10^{20}$ at/cm$^3$);
- by deposition of a metallic thin layer, for example of Pt or TiN;
- in silicide, such as SiPt, AlSi, TiSi, NiSi, WSi$_2$;
- by combining the above procedures.

As explained earlier, these resistances are arranged in zones of the freed mechanical structure where the flexural strain in the plane is of a single sign, such that a flexion of the said structure in a plane parallel to the substrate induces in the resistance a non-zero average strain (for use of the transducer in detection), and vice versa so that a mechanical strain engendered by thermal expansion causes such a flexion (for use of the transducer in actuation).

A device according to the invention generally also comprises other elements, such as current injection zones, connection lines, contact pads. According to the embodiments considered the zones may be either totally freed, or partially freed.

The use of SOI is merely a nonlimiting example. It will also be possible for a device according to the invention to be produced from another material, for example a heterostructure comprising a two-dimensional electron gas, or any other structure capable of defining a current path. It is possible to use for example an MOS (metal-oxide-semi-conductor) structure, of normally passing or normally blocked type. In the latter case, it is possible to use an electrostatic grid to create a channel of carriers. In fact, it is possible to use any conducting material that can be freed and that has mechanical properties that are good enough to generate desired resonant frequencies.

The figures hereinafter do not show all the production details of devices according to the invention, but mainly certain aspects such as the shape and the arrangement of the lateral injectors and resistive zones forming the transducers, the electrical interconnections, the contact pads and the actuation and detection electrical circuits.

Figure 3A:
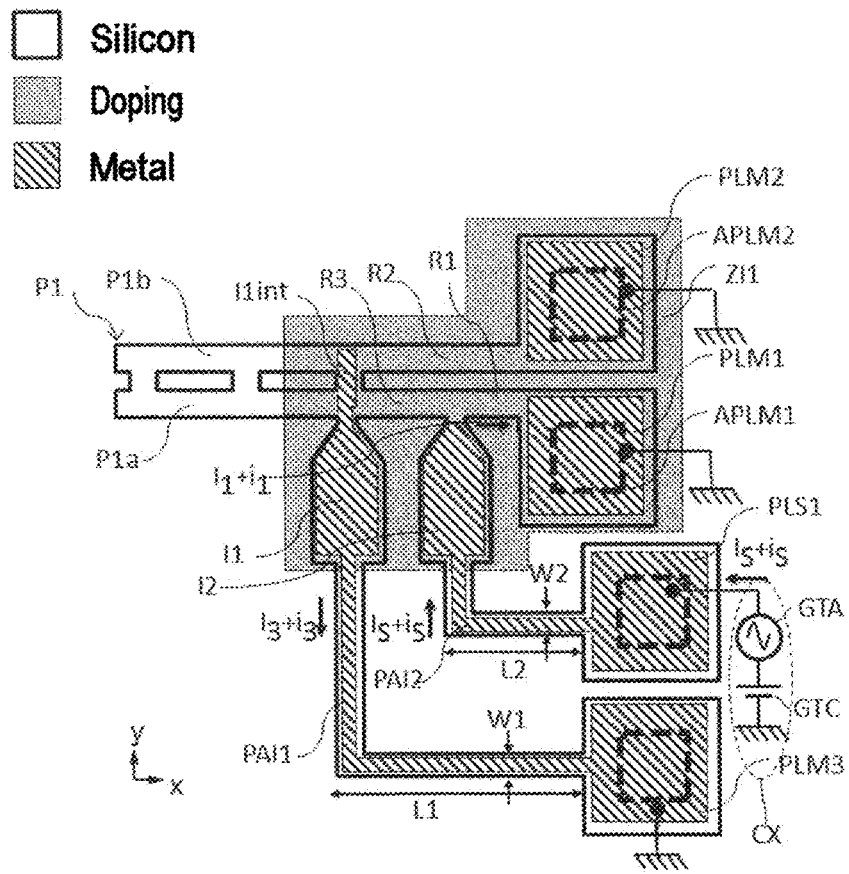
FIGS. 3a and 3b show devices according to two variants of a first embodiment of the invention.

The device of FIG. 3a comprises a mechanical structure P1, produced inside the device layer of an SOI stack and freed from the substrate by etching of the buried oxide, extending in a direction×termed longitudinal. The structure P1 is not, in this case, a simple beam, but exhibits a more complex composite structure, which comprises two parallel longitudinal beams P1a, P1b linked by crosspieces.

All the silicon inside the region ZI1 is "n+" doped, thus allowing the formation of ohmic contacts by deposition of metal layers. Two metallic depositions PLM1, PLM2, of large dimensions (for example, at least 5 μm×5 μm) with respect to the transverse dimension (y axis) of P1 and situated near the anchorages of P1a and P1b, on regions of the device layer which are fastened to the substrate, form two contact pads. In the example of FIG. 3a, the doped silicon regions carrying the contact pads PLM1, PLM2 comprise a central portion APLM1, APLM2 fastened (anchored) to the substrate and a peripheral region which can be freed. In the embodiment considered, the portions APLM1, APLM2 are in fact where the mechanical structure P1 is built-in or anchored.

Two injectors I1 and I2 are produced in doped and freed portions of the device layer which are fastened to the structure P1 and covered with metallic layers forming ohmic contacts. These injectors serve to reduce the contact resistances of a resistive transducer formed by the portions R1 and R3 of the beam P1a. More precisely, the first injector I1 and the second injector I2 extend in the transverse or lateral direction y from the beam I2, the second injector I2 being situated between the first injector I1 and the contact pad PLM1. The injector I1 is prolonged by an element I1int, also made of doped silicon covered with metal, which extends above the two beams P1a and P1b. In order to minimize their inertia so as not to overly affect the mechanical properties of the structure P1, the injectors should be as close as possible to the anchorages of the said structure; ideally, the join region extending from the anchorages to the most distant injector should not exceed a fifth, or indeed a tenth, of the extent of the structure P1 in the longitudinal direction x.

The injectors I1, I2 are linked to respective contact pads, PLM3, PLS1, by metallic tracks carried by beams PAI1, PAI2. The latter are formed in the device layer of the SOI structure, are completely freed and exhibit high flexibility (preferably greater than that of the structure P1) in the y direction. In the example of FIG. 3a this flexibility is obtained by taking "L"-shaped beams, of small width W1, W2 relative to the length L2, L3 of the arm of the "L" oriented along y; for example, the ratio L2/W2 must preferably be greater than twice the ratio of the length of the resistive region R1 to the width of the beam P1a, and the ratio L1/W1 be greater than twice the ratio of the aggregate length of the resistive regions R1 and R3 to the width of the beam P1a. It is of course possible to use different shapes, for example with meanders. In numerous cases, it is a question of obtaining both high flexibility and low inertia; in other cases it will be possible for the stiffness of the beams supporting the metallic tracks to be utilized to increase the resonant frequency of the device. On the other hand, the contact pads PLS1, PLM3 exhibit a similar structure to that of PLM1, PLM2 and are therefore fastened to the substrate, at least in their central part.

It is understood that, in other embodiments, the number of lateral injection zones could be greater than two. These lateral injection zones need not necessarily be arranged as close as possible to where the longitudinal structure P1 is built-in, although this is often considered advantageous.

The device of FIG. 3a can be actuated by applying to the pad PLS1 an alternating electrical signal at a frequency f=2πω, preferably corresponding to a resonance of the longitudinal structure P1 (or more generally close to this resonance), generally superimposed on a signal of direct type, while the pads PLM1 and PLM3, and optionally also PLM2, are grounded. In the example of FIG. 3a, these signals are generated, respectively, by an AC voltage generator GTA connected in series to a DC voltage generator GTC, these two generators forming an excitation circuit CX. A current $I_s+i_s$ ("I" designating a direct current and "i" an alternating current) therefore passes through the metallic track PAI1, is injected into the joining portion of the beam P1a via the injector I2, and splits into two components. A first component $I_1+i_1$ passes through the resistive region R1 of the beam P1a and returns to ground via the pad PLM1 (which also constitutes an injection zone or injector, although not "lateral", characterized by a low impedance); a component $I_3+i_3$ passses through the resistive region R3 of the beam P1a and returns to ground via the injector I1, the conducting track deposited on the freed beam PAI1 and the pad PLM3. These currents produce a heating of the resistive regions R1 and R3 and therefore a thermal expansion of the joining portion of the beam P1a, comprising these two resistive regions and the injectors I1, I2. On the other hand, almost no current passes through the resistive region R2 of the beam P1b, which therefore does not expand.

The flexion of the structure P1 is proportional to the thermal power $P_{th}$ dissipated in R1 and R3, which equals:

$$P_{th} = \frac{1}{R}\{U^2 + u^2\sin^2\omega t + 2Uu\cdot\sin\omega t\} \qquad (3)$$

where $R=R_1/R_3$ (assuming the other resistances are negligible), U is the DC voltage generated by GTC and u the amplitude of the AC voltage alternating at the frequency $f=\omega/2\pi$ generated by GTA. A distinction is made between a direct term, of no interest, a term at a frequency $2f$ and a term at the frequency f. If we choose U>>u (for example U≥10 u), the term at the frequency $2f$ is negligible, and the structure P1 is set into oscillation at the frequency f. In fact, the function of the DC voltage is to, as it were, "amplify" the effect of the AC voltage.

A significant aspect of the invention is that the resistive regions R1 and R3 exhibit a relatively low length/width ratio (typically between 1 and 5, thereby corresponding to a resistance of between 10Ω and 50Ω, assuming a sheet resistance of 10 Ohms, and are moreover connected in parallel. Thus, the resistance R=R1/R3 can exhibit a low value which, as may be seen in the equation hereinabove, increases the power dissipated in the thermal actuator.

In the example of FIG. 3a, the resistive region R2 is passive. As a variant, it could be used as piezo-resistive sensor to detect the oscillations of the structure P1, as in the case of FIG. 3b, or carry a conducting track linking I1int to the contact pad PLM1, as in the case of FIGS. 4a and 4b described further on.

The metal layer deposited on the injector I1int defines an ground plane, or at the very least a plane of very low potential, which prevents the actuation signal from propagating in the structure P1 beyond the joining portion. It is also possible to add another ground plane, if necessary, by means of a structure similar to (I2, PAI2, PLS1) but situated on the opposite side of I1.

The DC voltage generator GTC could be replaced with a DC current generator, or be absent—in which case it would be appropriate to use an AC excitation current alternating at a frequency f/2 so as to obtain, via the quadratic term of equation (3), an excitation of the mechanical structure P1 at a frequency f close or identical to its resonant frequency $f_0$. The AC voltage generator could be replaced with an AC current generator or with a radiofrequency generator. It is even possible to envisage quasi-static operation, not using an AC generator.

As a variant, the excitation circuit CX could be replaced with a resistance measurement circuit, allowing the detection of an oscillation of the structure P1 that is manifested by a variation in the resistance of R1/R3 by piezo-resistive effect. This case will be described more particularly with reference to FIG. 3b. It is also possible to use a circuit allowing both the excitation of the oscillation of the structure P1 by thermal actuation and the detection of this oscillation by piezo-resistive effect; in particular, this is possible if, as was mentioned earlier, the excitation is obtained using an AC current alternating at the frequency f/2; in this case, the excitation signal (f/2) and the measurement signal (f) can be separated by electric filters. However, this is not a preferred embodiment.

Figure 3B:
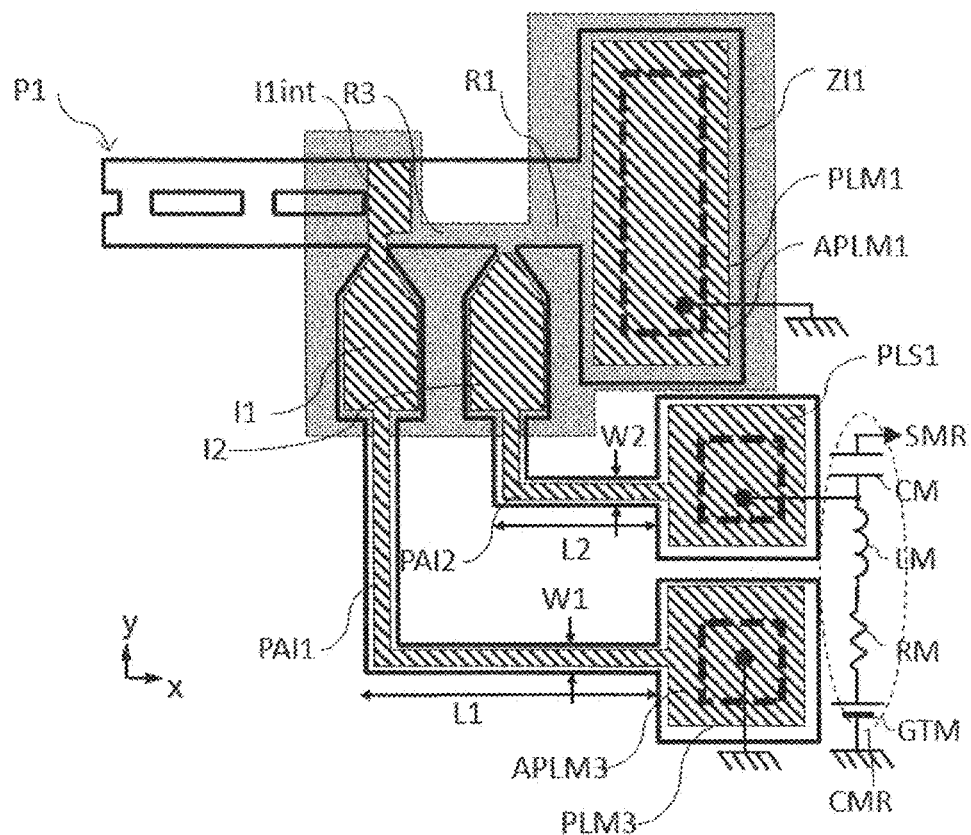

The device of FIG. 3b constitutes a variant of that of FIG. 3a. The main differences are as follows:

- The resistances R1, R3 are not defined by etching, but solely by the shape of the doping region ZI1; there is therefore no resistive region R2.
- The contact pad PLM2 is absent, while the pad PLM1 is wider, extending over the entire anchorage region of the structure P1.
- The voltage generators GTC, GTA are replaced with a circuit for measuring the resistance CMR, making it possible to use the resistive regions R1, R3 as piezo-resistive sensors.

The circuit CMR comprises a continuous or slowly varying (frequency not greater than f/10) voltage—or current—generator GM linked to the pad PLS1 by way of a resistance RM and of an inductance LM in series (the resistance RM may simply be the internal resistance of the generator); such a topology is known by the name "bias T" (or "bias tee"). The voltage fluctuations, at the frequency f, induced by the periodic variations in resistance of the assembly R1/R3 are tapped off from an output SMR by way of a link capacitor CM. As a variant, it would be possible to use a high-frequency measurement generator (frequency F greater than or equal to 10f), and detect a measurement signal at F+f or F−f which is thereafter demodulated.

Figure 4A:
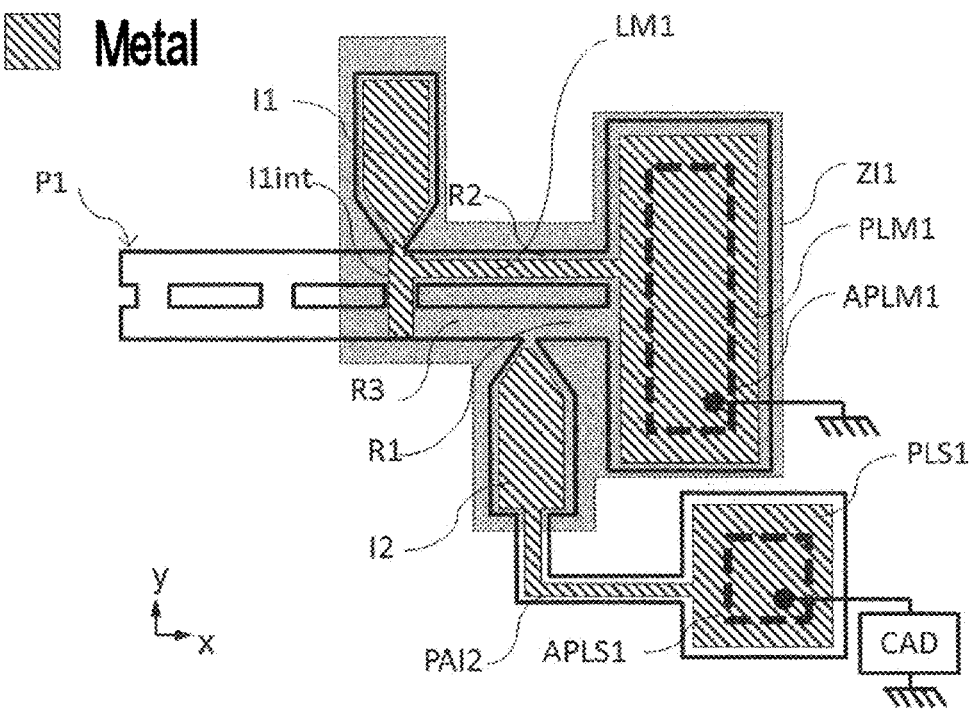
FIGS. 4a, 4b and 4c show devices according to three variants of a second embodiment of the invention.

In the device of FIG. 4a, only the injector I2 is connected to a connection pad (PLS1) by a metallic line carried by a flexible beam PAI1, while the injector I1 is linked to the pad APLM1, which covers the anchorage of the structure P1, by a metallic line—or in any event a strongly conducting line—LM1 extending above the resistive region R2 which is thus short-circuited. As a variant, it would be possible to have two distinct contact pads in correspondence with the places where P1 is built-in, as in the case of FIG. 3a; in this case, by virtue of the presence of LM1, the two pads would have an ground pad function.

The pad PLM1 is grounded, while the pad PLS1 is linked to an actuation and/or detection circuit which can, for example, operate in the manner described above with reference to FIGS. 3a and 3b.

The use of the metallic line above R2 is counter-intuitive, since it is subjected to a strain of opposite sign to that acting on R1 and R3. Indeed, the layer LM1 has a much lower gauge factor than R1, R3 and since it involves metal or a highly conducting layer, it short-circuits R2. Therefore, the current in R1 and R3 will dominate the piezo-resistive response.

When used as an actuator, it might be objected that the Joule power passing on the side of R2 will contribute to heating the upper arm of the beam whereas it is desired to heat only the side R1, R3. But in fact, as LM1 is made of metal, the potential on I1int is close to 0. The product U*I is therefore extremely small compared with the product U*I in R3 and R1 which are supplied via the non-zero potential of I2.

It is noted that, in the device of FIG. 4a, the injector I1 extends in a lateral direction opposite to that of I2, this having the effect of balancing P1. Such an arrangement, which is optional, can also be used in the other embodiments.

Figure 4B:
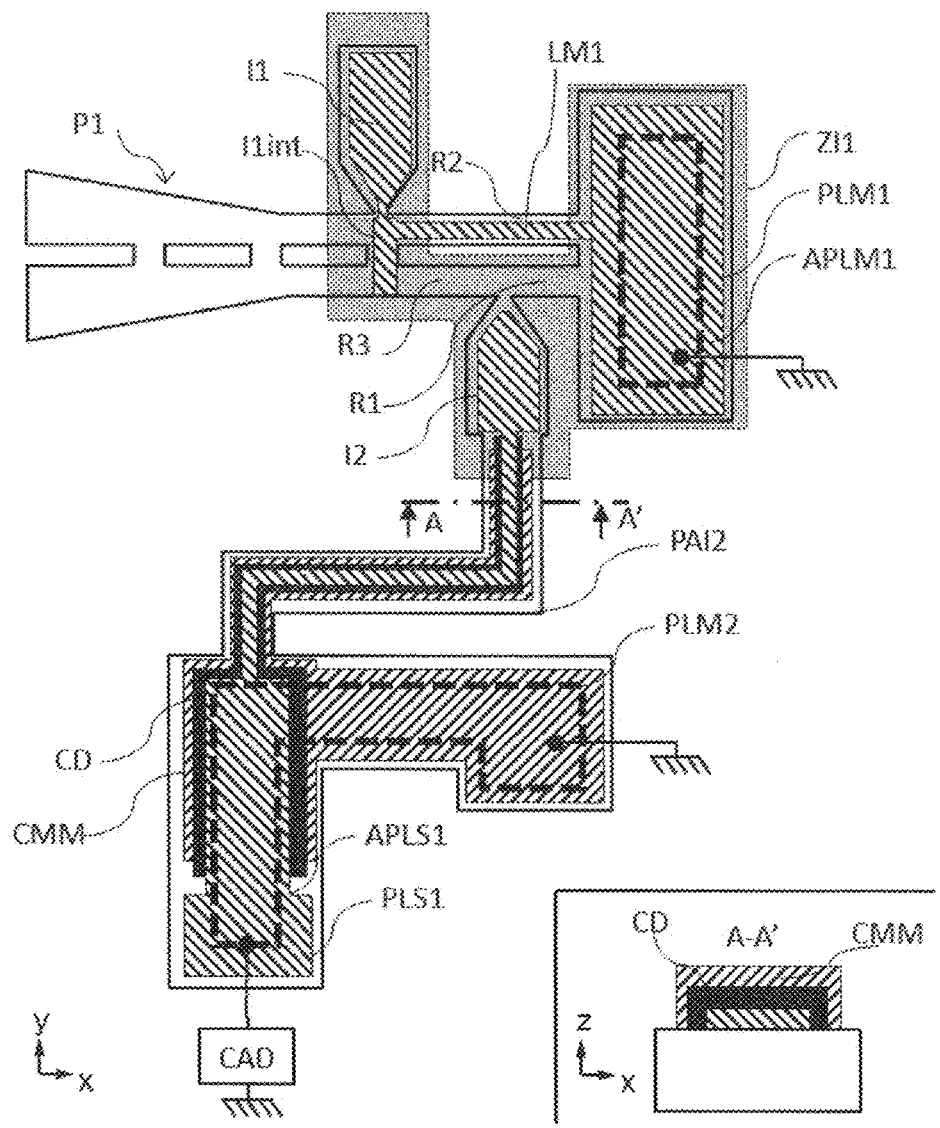

FIG. 4b illustrates a variant of the device of FIG. 4a, in which a dielectric layer CD, made for example of silicon oxide ($SiO_2$) or of parylene, covers the injector I2 and the signal line linking this injector to the signal contact pad PLS1, and optionally a part of the pad itself. A metallic layer CMM is deposited above this dielectric layer and grounded via a contact pad PLM2 (or, as a variant, the pad PLM1). This makes it possible to insulate the signal line from electromagnetic disturbances. The layers CMM and CD are particularly clearly visible on the insert, which shows a sectional view of the structure along the line A-A'.

The doubly bent shape of the flexible beam PAI2 is also noted.

Figure 4C:
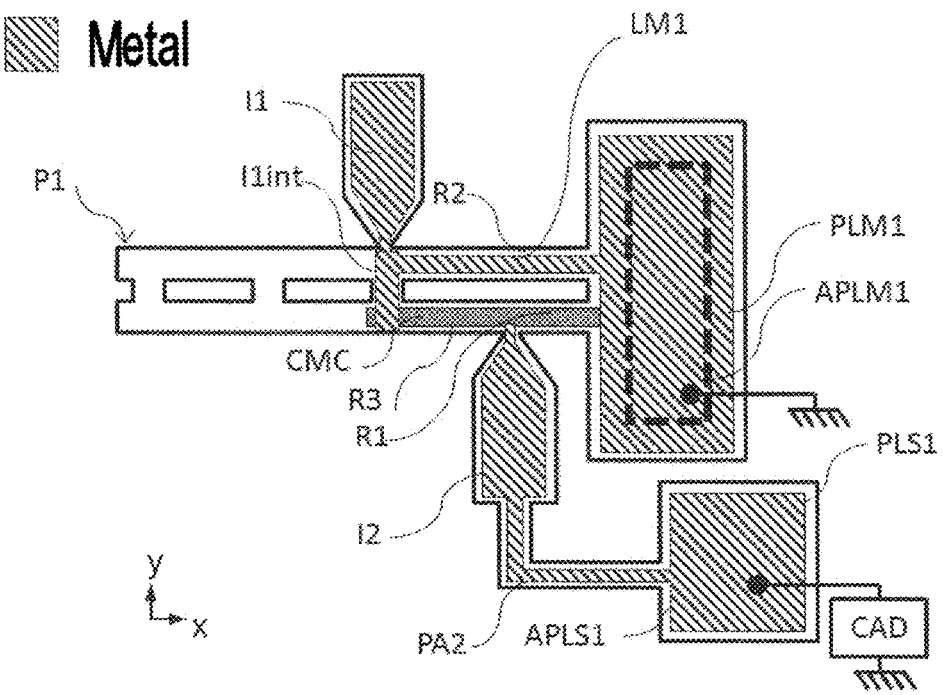

FIG. 4c illustrates a variant in which there is no longer any implanted zone ZI1 and the resistances R1 and R3 consist of a conducting thin layer CMC, for example made of a deposited metal, such as platinum, by silicide (alloy of silicon and of a metal such as platinum, aluminium, etc), or by highly localized implantation.

Figure 5:
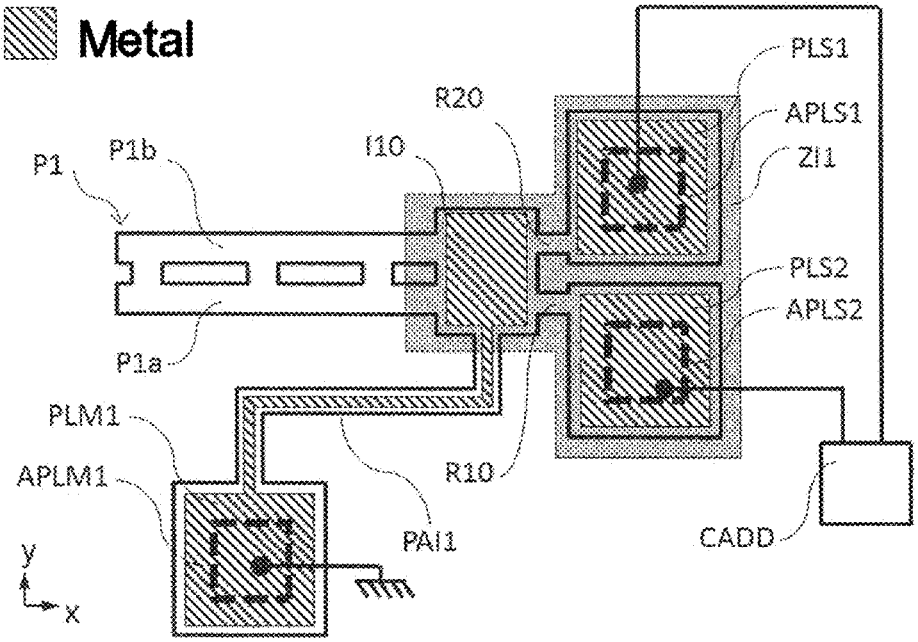
FIG. 5 shows a device according to a fourth embodiment of the invention.

The device of FIG. 5 allows operation in differential mode. In this device, the longitudinal structure P1 exhibits the same composite structure as in the case of FIG. 3a: it comprises two parallel longitudinal beams P1a, P1b built-in separately. Two metallizations form contact pads PLS1, PLS2 above the anchorages APLS1, APLS2 of these beams. A single injector I10 extends above the, doped, joining portions of the beams P1a, P1b, and is linked by a conducting line deposited on a flexible freed beam PAI1 to an grounded contact pad PLM1. Two resistive regions R10, R20 are defined in the joining portions of P1a and of P1b, respectively. It is understood that, when using the device in detection mode, a flexion of the structure P1 in the plane affects the resistance of R10 and of R20 in an opposite manner; it is therefore possible to perform a differential resistance measurement to detect the oscillations of P1 with increased sensitivity.

Reciprocally, it is possible to produce a differential actuation by applying to PLS1 and PLS2 voltages alternating in phase opposition, superimposed on DC voltages—or indeed AC voltages in phase quadrature, at a frequency equal to half the oscillation frequency of P1 that is sought, in the absence of a DC component.

In FIG. 5, the reference CADD designates a differential actuation and/or detection circuit.

The longitudinal structure P1, actuated in flexion, can in its turn act on another micromechanical member of a more complex system, by causing and/or by detecting its motion or its deformation. Examples of such systems are illustrated by FIGS. 6 to 10.

FIG. 6 represents a complex microelectromechanical system—an atomic force microscopy (AFM) probe—implementing two devices according to the invention. The atomic force microscopy probe comprises an AFM tip, PAFM, carried by a beam PL which protrudes from the edge of a substrate S. The beam PL can oscillate in its longitudinal direction (x), parallel to the plane of the substrate. Accordingly, it is suspended with the aid of two lateral arms P1, P1' belonging to devices of the type of FIG. 4a. The references PLM1, PLS1, I1, I2 designate the contact pads and the injectors of the first device D, the references PLM1', PLS1', I1', I2' the corresponding elements of the second device D'.

The first device D is linked to an excitation circuit CX and serves for the actuation of the beam PL; the second device D' is linked to a measurement circuit CMR to detect the oscillations of the said beam.

Figure 9A:
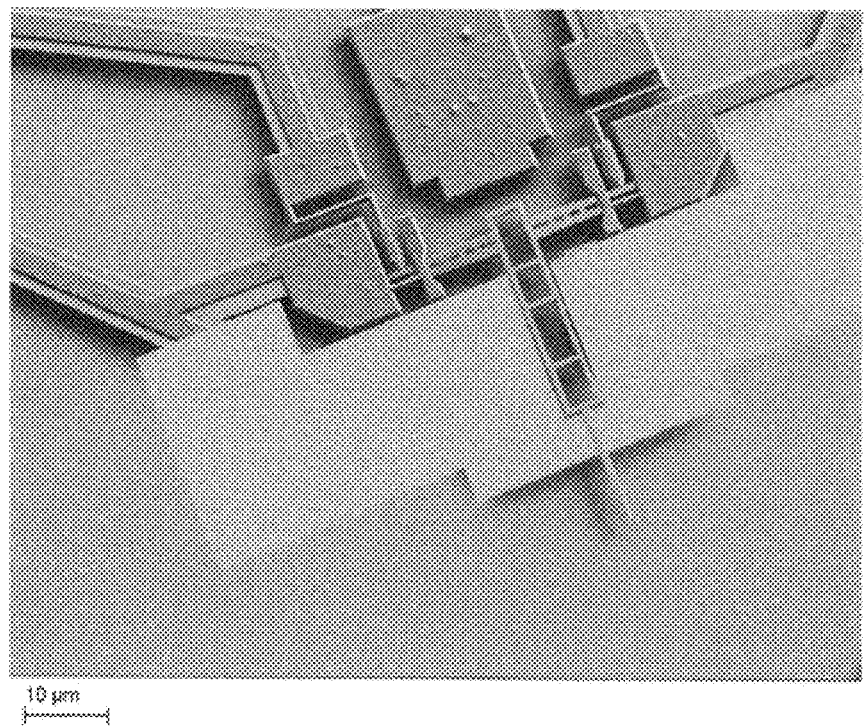
FIGS. 9a and 9b show two images, obtained by electron microscopy, of a system of the type represented schematically in FIG. 6.
Figure 9B:
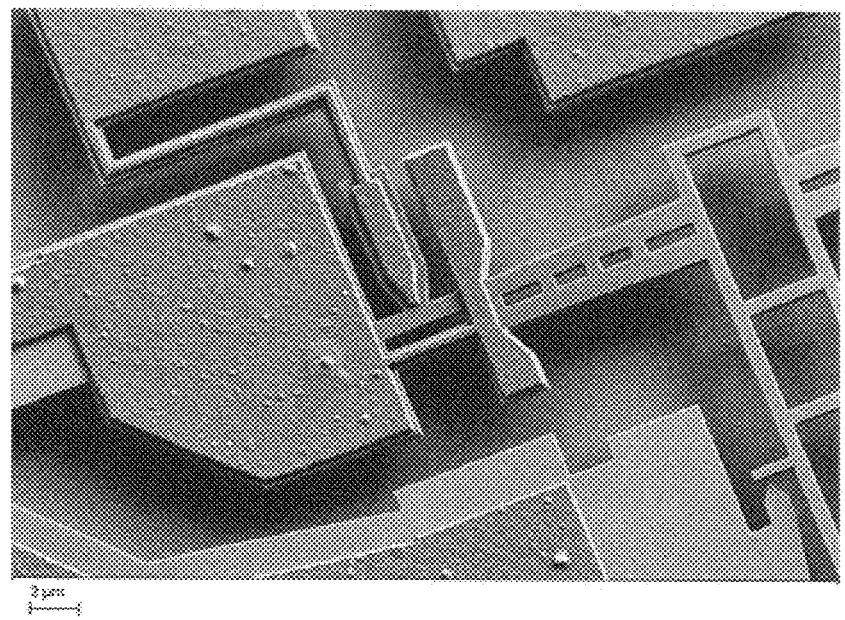
Figure 10:
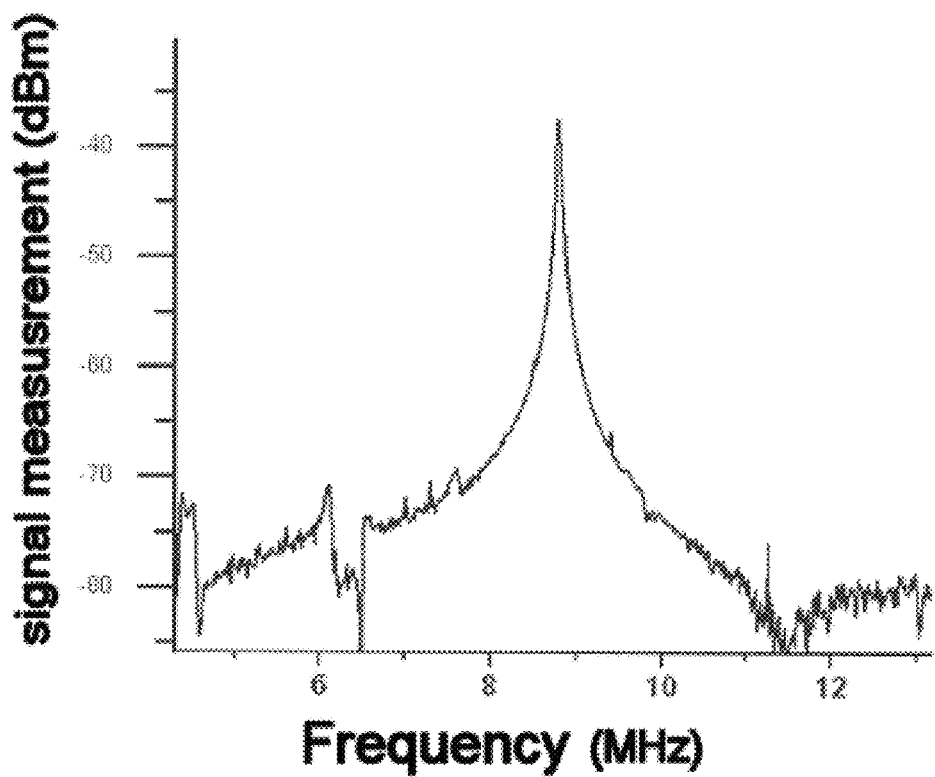
FIG. 10 illustrates the results of a measurement performed in the system of FIGS. 9a and 9b.

A system of this type has been produced in SOI technology. FIG. 9a shows an image thereof obtained by electron microscopy (certain parts of the image, of no interest for the understanding of the invention, are hidden). FIG. 9b is a detail view showing the injectors I1, I2. FIG. 10 illustrates the results of a measurement performed by exciting the oscillation of the system by injecting an electrical signal of amplitude 2 dBm, whose frequency scans the range 2-6.5 MHz. The mechanical oscillation of the system, at a frequency double that of the excitation signal, is detected by applying a DC bias voltage of 0.2 V to a detection circuit. The measurement curve, reproduced in the figure, shows a spike of Lorentzian type, with a resonant frequency at 8.78 MHz.

FIG. 7 shows a microelectromechanical system analogous to that of FIG. 6, but using two devices of the type of FIG. 5, allowing actuation and detection of differential type.

The references PLM2, PLS1, PLS2, I10 designate the contact pads and the injectors of the first device D, the references PLM2', PLS1', PLS2', I10' the corresponding elements of the second device D'. The device D is used in actuation; its pads PLS1, PLS2 are linked to a differential-actuation circuit CAD to receive two alternating electrical signals of the same frequency and in phase opposition, obtained by using a common generator and a 180° phase shifter, superimposed on a DC component. The device D' is used in detection; its pads PLS1', PLS2' are linked to the inputs of a differential-detection circuit CDD.

FIG. 8 illustrates a microelectromechanical system of accelerometer type using two devices D, D' of the type of FIG. 3b. The references I1, I2, PLM1, PLM2, PLS1, PLS2 represent the injectors and the contact pads of the device D, the references I1', I2', PLM1', PLM2', PLS1', PLS2' the same elements of the device D'.

The system comprises an element of beam type PL, extending in a direction y, connected to a mobile mass MM by way of another beam PMM extending in the perpendicular direction x. This mobile mass is anchored at AMM1 and AMM2. One of the two devices, D for example, makes it possible to set the beam PMM into oscillation while the second system, D' for example, measures the resonant frequency of the said beam. During an acceleration the mobile mass moves, compresses or stretches the beam PMM and induces a detectable modification of its resonant frequency.

The invention claimed is:

1. A microelectromechanical device comprising a mechanical structure extending mainly along a longitudinal direction and linked to a planar substrate by at least one anchorage situated at one of its ends along the longitudinal direction and able to flex in a plane parallel to the substrate, the mechanical structure comprising a joining portion which links the mechanical structure to the said at least one anchorage and which includes a resistive region exhibiting a first injection zone and a second infection zone for injecting an electric current so as to form a resistive transducer, the resistive region extending mainly in the longitudinal direction from said at least one anchorage and being arranged in such a way that a flexion of the mechanical structure in the plane parallel to the substrate induces a non-zero average strain in the resistive region and vice versa;
   wherein the first injection zone is carried by the at least one anchorage; and
   wherein the second injection zone is carried by a first conducting element not fixed to the substrate and extending in a lateral direction substantially perpendicular to the longitudinal direction;
   the substrate being parallel to a plane defined by the longitudinal direction and the lateral direction.

2. The microelectromechanical device according to claim 1, wherein the resistive region also exhibits at least one third infection zone for injecting an electric current carried by a second conducting element not fixed to the substrate, extending in the lateral direction and distinct from the first conducting element carrying the second injection zone, the second injection zone being arranged between the first injection zone and the third injection zone.

3. The microelectromechanical device according to claim 1, wherein the mechanical structure is made of semi-conducting material and the first and second injection zones comprise metallic layers deposited above respective portions of said semi-conducting material and forming ohmic contacts.

4. The microelectromechanical device according to claim 1, wherein at least one of the first injection zone and second injection zone extends over the entire width of the joining portion, beyond the extent of the resistive region.

5. The microelectromechanical device according to claim 1, wherein at least the second injection zone is linked to a contact pad fastened to the substrate by a beam-shaped element not fixed to the substrate and exhibiting a flexibility in the lateral direction.

6. The microelectromechanical device according to claim 5, wherein the beam-shaped element exhibits a flexibility in the lateral direction that is greater than that of the mechanical structure.

7. The microelectromechanical device according to claim 1, wherein the joining portion of the mechanical structure comprises at least two parallel beams, oriented along the longitudinal direction and disposed on either side of a neutral fibre of the joining portion, the resistive region being included in one of the beams.

8. The microelectromechanical device according to claim 1, wherein the joining portion of the mechanical structure comprises a single beam oriented along the longitudinal direction, the resistive region being arranged on a side of the beam, the remainder of the beam being made of material exhibiting a higher electrical resistivity.

9. The microelectromechanical device according to claim 1, further comprising an electrical detection circuit, configured to measure a time-varying electrical resistance of the resistive region between the first injection zone and second injection zone.

10. The microelectromechanical device according to claim 1, further comprising an electrical actuation circuit, configured to inject an alternating electrical signal into the resistive region by way of the first injection zone and second injection zone.

11. The microelectromechanical device according to claim 1, wherein the mechanical structure comprises two resistive regions included in the joining portion and arranged in such a way that a flexion of the joining portion in a plane parallel to the substrate induces non-zero average strains of opposite sign in the resistive regions, each resistive region exhibiting a first zone and a second zone for injecting an electric current, the first zone for injecting an electric current being disjoint.

12. The microelectromechanical device according to claim 11, further comprising an electrical detection circuit, configured to measure a difference, varying over time, between resistances of the first zone and second zone for injecting an electric current.

13. The microelectromechanical device according to claim 11, further comprising an electrical actuation circuit configured to inject alternating electrical signals at an actuation frequency and in phase opposition, superimposed on a direct electrical signal or at a different frequency from the actuation frequency, into the two resistive regions by way of the first zone and second zone for injecting an electric current of said two resistive regions.

14. The microelectromechanical device according to claim 11, further comprising an electrical actuation circuit configured to inject alternating electrical signals at an actuation frequency, and in phase quadrature, without superposition with a direct electrical signal or at a different frequency from the said actuation frequency, into said two resistive regions by way of the first zone and second zone for injecting an electric current of said two resistive regions.

15. The microelectromechanical system comprising a first microelectromechanical device according to claim 1 which further comprises an electrical detection circuit, configured to measure a time-varying electrical resistance of the resistive region between the the first injection zone and the second injection zone, and a second microelectromechanical device according to claim 1 which further comprises an electrical actuation circuit, configured to inject an alternating electrical signal into the resistive region by way of the the first injection zone and the second injection zone, wherein the mechanical structures of the first and of the second device are mechanically coupled, the actuation circuit of the first device is configured to inject an alternating electrical signal at an actuation frequency, superimposed on a direct electrical signal or at a different frequency from the actuation frequency, and the detection circuit of the second device is configured to measure a variation in resistance at the actuation frequency.

16. The microelectromechanical system comprising a first microelectromechanical device according to claim 11 which further comprises an electrical actuation circuit configured to inject alternating electrical signals at an actuation frequency, and in phase quadrature, without superposition with a direct electrical signal or at a different frequency from the said actuation frequency, into said two resistive regions by way of the first zone and second zone for injecting an electric current of said two resistive regions, and a second microelectromechanical device according to claim 11 which further comprises an electrical detection circuit, configured to measure a difference, varying over time, between resistances of the first zone and second zone for injecting an electric current, wherein the mechanical structures of the first and of the second device are mechanically coupled, the actuation circuit of the first device is configured to inject an alternating electric current at a first frequency and the detection circuit of the second device is configured to measure a variation in resistance at a second frequency, double the first frequency.

17. The microelectromechanical system comprising a first microelectromechanical device according to claim 1 which further comprises an electrical detection circuit, configured to measure a time-varying electrical resistance of the resistive region between the first injection zone and the second injection zone, and a second microelectromechanical device according to claim 1 which further comprises an electrical actuation circuit, configured to inject an alternating electrical signal into the resistive region by way of the first injection zone and the second injection zone, wherein the mechanical structures of the first and of the second device are mechanically coupled, the actuation circuit of the first device is configured to inject an alternating electrical signal at a first frequency, without superposition with a direct electrical signal, and the detection circuit of the second device is configured to measure a variation in resistance at a second frequency, double the first frequency.

* * * * *

UNITED STATES PATENT AND TRADEMARK OFFICE
CERTIFICATE OF CORRECTION

PATENT NO. : 9,815,686 B2  
APPLICATION NO. : 15/293147  
DATED : November 14, 2017  
INVENTOR(S) : Benjamin Walter et al.

Page 1 of 1

It is certified that error appears in the above-identified patent and that said Letters Patent is hereby corrected as shown below:

In the Claims

In Line 13, Column 12 in Claim 1, "second infection zone" should be --second injection zone--;

In Line 31, Column 12 in Claim 2, "third infection zone" should be --third injection zone--.

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*